United States Patent [19]

Jen et al.

[11] Patent Number: 6,115,834
[45] Date of Patent: Sep. 5, 2000

[54] METHOD FOR QUICKLY IDENTIFYING FLOATING CELLS BY A BIT-LINE COUPLING PATTERN (BLCP)

[75] Inventors: Tean-Sen Jen, Chiayih; Shiou-Yu Wang, Taipei; Wu-Der Yang, Taoyuan; Chang-Pin Chen, Taipei, all of Taiwan

[73] Assignee: Nanya Technology Corporation, Taiwan

[21] Appl. No.: 09/146,042

[22] Filed: Sep. 2, 1998

[30] Foreign Application Priority Data

Sep. 17, 1997 [TW] Taiwan ................................. 86113473

[51] Int. Cl.$^7$ .............................. G11C 29/00; G11C 7/00
[52] U.S. Cl. .................. 714/718; 764/721; 365/189.11; 365/201; 365/203; 365/230.06
[58] Field of Search ..................................... 714/711, 718, 714/721, 723, 724; 365/185.17, 185.21, 185.23, 185.26, 189.07, 189.09, 189.11, 200, 201, 203, 210, 230.06

[56] References Cited

U.S. PATENT DOCUMENTS

| | | | |
|---|---|---|---|
| 4,404,655 | 9/1983 | Naiff | 365/104 |
| 5,343,431 | 8/1994 | Ohtsuka | 365/201 |
| 5,351,214 | 9/1994 | Rouy | 365/185.21 |
| 5,400,344 | 3/1995 | Mori | 714/721 |
| 5,428,621 | 6/1995 | Mehrotra et al. | 714/721 |
| 5,539,694 | 7/1996 | Rouy | 365/189.09 |
| 5,606,527 | 2/1997 | Kwack et al. | 365/201 |
| 5,748,545 | 5/1998 | Lee et al. | 365/201 |

Primary Examiner—Emmanuel L. Moise
Attorney, Agent, or Firm—Michael D. Bednarek; Crowell & Moring LLP

[57] ABSTRACT

A method for quickly identifying floating cells by a bit-line coupling pattern (BLCP), an electronic analysis method, identifies floating cells by inputting different background data and inducing net charges from adjacent bit-lines to the bit-lines corresponding to floating cells by coupling parasitic capacitors, wherein the floating results from open bit-line contacts and/or open DRAM cell contacts. Moreover, a method for identifying floating cells according to the invention has the advantages of high efficiency and low cost.

6 Claims, 4 Drawing Sheets

第 2 圖

|  $DC_{1n}$ | $DC_{2n}$ | $DC_{3n}$ | $DC_{4n}$ | |
|---|---|---|---|---|
| 0 | 0 | 0 | 0 | $n=1$ |
| 0 | 0 | 0 | 0 | $n=2$ |
| 0 | 0 | 0 | 0 | $n=3$ |

FIG. 3

|  $DC_{1n}$ | $DC_{2n}$ | $DC_{3n}$ | $DC_{4n}$ | |
|---|---|---|---|---|
| 0 | 0 | 0 | 0 | $n=1$ |
| X | 1 | 1 | X | $n=2$ |
| 0 | 0 | 0 | 0 | $n=3$ |

FIG. 4

| $DC_{1n}$ | $DC_{2n}$ | $DC_{3n}$ | $DC_{4n}$ | |
|---|---|---|---|---|
| 1 | 1 | 1 | 1 | n=1 |
| 1 | 1 | 1 | 1 | n=2 |
| 1 | 1 | 1 | 1 | n=3 |

FIG. 5

| $DC_{1n}$ | $DC_{2n}$ | $DC_{3n}$ | $DC_{4n}$ | |
|---|---|---|---|---|
| 1 | 1 | 1 | 1 | n=1 |
| X | 0 | 0 | X | n=2 |
| 1 | 1 | 1 | 1 | n=3 |

FIG. 6

METHOD FOR QUICKLY IDENTIFYING FLOATING CELLS BY A BIT-LINE COUPLING PATTERN (BLCP)

BACKGROUND OF THE INVENTION

1. Field of the Invention

The invention relates to a method for identifying floating cells, and in particular to a method for quickly identifying floating cells by a bit-line coupling pattern (BLCP).

2. Description of Related Art

There has been rapid growth in the demand for larger and faster memories for personal computers, workstations, communication systems, and graphics subsystems. These systems use memories to write, store, and retrieve large amounts of data. The data represent information or program instructions that are coded in combinations of the binary digits (bits) "1" and "0," and can be used by the microprocessor for further manipulation. Basically, there are two kinds of memories. One is nonvolatile memory (NVM), such as magnetic, optical media as well as some specially designed semiconductor ROM. The information last written in those memories is retained permanently, even after the power supply is removed. The other is volatile memory (VM), such as static random access memory (SRAM) and dynamic random access memory (DRAM). The volatile memories lose the stored information when the power is turned off.

In fact, the RAM which constitutes most semiconductor memory allows any part of the memory to be read or written as fast as any other part. The above-mentioned DRAM contains a great amount of DRAM cells, wherein each DRAM cell consists of one transistor and one capacitor. Currently, the high density and low cost of DRAMs have earned them a predominant role in computer main memories. During the past 35 years, the number of DRAM bits/chip has increased by a factor of four every three years and the cost/bit has declined by roughly the same factor.

However, during the manufacture of DRAM devices, floating problems of DRAM cells including open bit-line contacts and open DRAM cell contacts are encountered, resulting in the malfunction of DRAM devices. Generally, in the prior art, floating DRAM cells can be identified by use of physical failure analysis which includes focus ion beam (FIB) and secondary electronmicroscopy (SEM) approaches. When using the focus ion beam approach to identify floating DRAM cells, the addresses of suspicious floating DRAM cells must first be located, then the located DRAM cells are cut by FIB to analyze whether the located DRAM cells are floating cells or not. Another FIB approach involves removing upper layers of the DRAM device to expose the required DRAM cells for observation. IF the DRAM cells are bright, it means that there are no floating problems. Conversely, if the DRAM cells are dark due to accumulated positive charges which can not flow, these observed DRAM cells are floating cells. The secondary electronmicroscopy approach involves first fixing the DRAM devices and then cutting them in order to directly observe the cross-section of DRAM cells to identify whether or not there are floating DRAM cells. Nevertheless, the above-mentioned approaches for identifying floating DRAM cells have the disadvantages of low efficiency and high cost.

SUMMARY OF THE INVENTION

In view of the above, the object of the invention is to provide a method for quickly identifying floating cells by a bit-line coupling pattern (BLCP). A method for quickly identifying floating cells by a bit-line coupling pattern according to the invention, an electronic analysis method, identifies floating cells by inputting different background data and inducing net charges from adjacent bit-lines to the bit-lines corresponding to floating cells through coupling parasitic capacitors to decide data logic levels of the floating cells, wherein the floating results from open bit-line contacts and open DRAM cell contacts.

Unlike the physical failure analysis used in the prior art, the method for quickly identifying floating cells by a bit-line coupling pattern according to the invention, an electric analysis, not only swiftly identifies floating cells, but also has the advantage of low cost.

BRIEF DESCRIPTION OF THE DRAWINGS

The present invention will become more fully understood from the detailed description given hereinbelow and the accompanying drawings, which are provided for illustration of preferred embodiments only and should not be construed as limiting the scope of the present invention, and wherein:

FIG. 3 is a table showing first background data according to an embodiment of the invention;

FIG. 4 is a table showing second background data according to an embodiment of the invention;

FIG. 5 is a table showing third background data according to an embodiment of the invention; and FIG. 6 is a table showing four background data according to an embodiment of the invention.

DETAILED DESCRIPTION OF THE INVENTION

Figure 1:
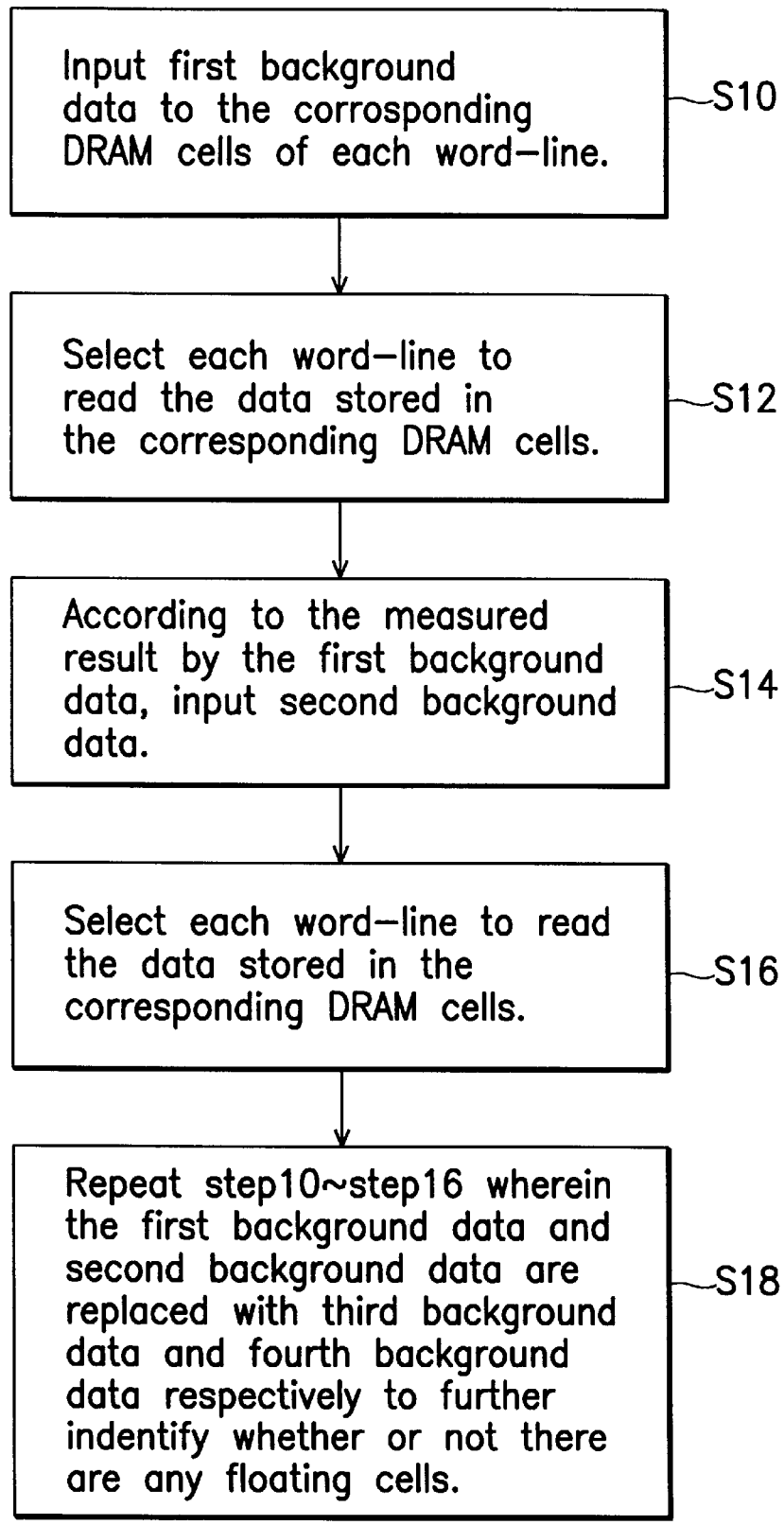
FIG. 1 is a flow chart illustrating a method for quickly identifying floating cells by a bit-line coupling pattern according to an embodiment of the invention.
Figure 2:
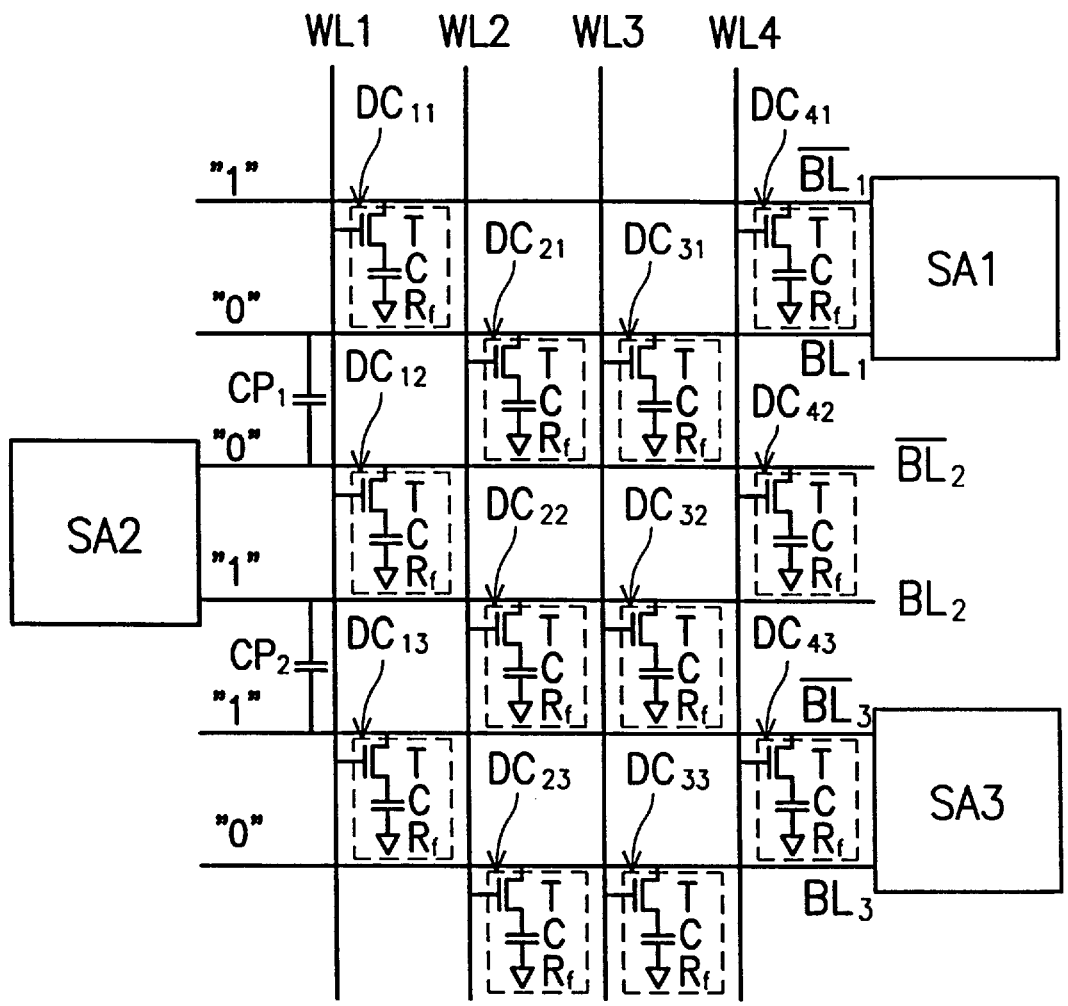
FIG. 2 is a circuit diagram illustrating a dynamic read only memory (DRAM)

Referring to FIG. 1, a flow chart shows a method for quickly identifying floating cells by a bit-line coupling pattern according to an embodiment of the invention. A method for quickly identifying floating cells by a bit-line coupling pattern according to the invention is suitable for dynamic random access memory (DRAM) as shown in FIG. 2, wherein only DRAM cells ($DC_{11}$, $DC_{12}$, $DC_{13}$), ($DC_{21}$, $DC_{22}$, $DC_{23}$), ($DC_{31}$, $DC_{32}$, $DC_{33}$) and ($DC_{41}$, $DC_{42}$, $DC_{43}$), first sense amplifier SA1, second sense amplifier SA2, and third sense amplifier SA3 are shown for convenience of explanation. In addition, the DRAM cells ($DC_{11}$, $DC_{12}$, $DC_{13}$), ($DC_{21}$, $DC_{22}$, $DC_{23}$), ($DC_{31}$, $DC_{32}$, $DC_{33}$) and ($DC_{41}$, $DC_{42}$, $DC_{43}$) are controlled by a first word-line WL1, a second word-line WL2, a third word-line WL3 and a fourth word-line WL4, respectively. The first sense amplifier SA1, second sense amplifier SA2, and third sense amplifier SA3 are connected to a first inverted bit-line $\overline{BL_1}$ and first bit-line $BL_1$ (first pair of bit-lines), a second inverted bit-line $\overline{BL_2}$ and second bit-line $BL_2$ (second pair of bit-lines), and a third inverted bit-line $\overline{BL_3}$ and third bit-line $BL_3$, (third pair of bit-lines) respectively, wherein each DRAM cell consists of a transistor T and a capacitor C and Rf is a reference voltage. As shown in FIG. 1, a method for quickly identifying floating cells by a bit-line coupling pattern comprises the steps as follows:

(1) In step 10 (S10), first background data is stored in the DRAM cells ($DC_{11}$, $DC_{12}$, $DC_{13}$), ($DC_{21}$, $DC_{22}$, $DC_{23}$), ($DC_{31}$, $DC_{32}$, $DC_{33}$) and ($DC_{41}$, $DC_{42}$, $DC_{43}$), wherein the first background data are all a logic level "0".

(2) In step 12 (S12), a signal of logic level "1" is input to the first word-line WL1, second word-line WL2, third word-line WL3 and fourth word-line WL4 in sequence to read the data stored in the corresponding DRAM cells ($DC_{11}$, $DC_{12}$, $DC_{13}$), ($DC_{21}$, $DC_{22}$, $DC_{23}$), ($DC_{31}$, $DC_{32}$, $DC_{33}$) and ($DC_{41}$, $DC_{42}$, $DC_{43}$), respectively by the first sense amplifier SA1, second sense amplifier SA2 and third sense amplifier SA3. The result shows that the reading data of the DRAM cells $DC_{22}$ and $DC_{32}$ are a logic level "1" which is different from the original inputted logic level "0." However, the reading data of the other DRAM cells except for the DRAM cells $DC_{22}$ and $DC_{32}$, obtained by means of charge sharing, are all a logic level "0" the same as the original inputted logic level "0." This result shows that the DRAM cells $DC_{22}$ and $DC_{32}$ may be floating cells which prevent formation of charge sharing to change the potential of the corresponding second inverted bit-line $\overline{BL_2}$ and second bit-line $BL_2$ by which the second sense amplifier SA2 defines the data stored in the DRAM cells $DC_{22}$ and $DC_{32}$ as a logic level "0." Instead, the corresponding second inverted bit-line $\overline{BL_2}$ and second bit-line $BL_2$ are coupled to the adjacent first bit-line $BL_1$ with a logic level "0" and the third inverted bit-line $\overline{BL_3}$ with a logic level "1" via a first parasite capacitor $CP_1$ and second parasitic capacitor $CP_2$, respectively, thereby making the second inverted bit-line $\overline{BL_2}$ a logic level "0" and the second bit-line $BL_2$ a logic level "1". Therefore the reading data of the DRAM cells $DC_{22}$ and $DC_{32}$ become a logic level "1." At this time, the logic levels of the first inverted bit-line $BL_1$ and the third bit-line $BL_3$ are "1" and "0," respectively, as shown in FIG. 2. Step 14 must be performed to determine whether or not the DRAM cells $DC_{22}$ and $DC_{32}$ are floating cells. In practical, parasitic capacitors all exit between bit-lines, but only capacitors $CP_1$ and $CP_2$ are shown in FIG. 2 for convenience of explanation;

(3) In step 14 (S14), based on the measured result by the first background data, second background data shown in FIG. 4 are inputted to the DRAM cells ($DC_{11}$, $DC_{12}$, $DC_{13}$), ($DC_{21}$, $DC_{22}$, $DC_{23}$), ($DC_{31}$, $DC_{32}$, $DC_{33}$) and ($DC_{41}$, $DC_{42}$, $DC_{43}$), wherein except for the data stored in the DRAM cells ($DC_{11}$, $DC_{21}$, $DC_{31}$, $DC_{41}$) and in the DRAM cells ($DC_{13}$, $DC_{23}$, $DC_{33}$, $DC_{43}$) which are all a logic level "0" and the data stored in the suspicious floating DRAM cells $DC_{22}$ and $DC_{42}$ are a logic level "1," the data stored in the other DRAM cells $DC_{12}$ and $DC_{42}$, marked with label X, can be a logic level "1" or "0."

(4) Similarly, in step 16 (S16), a signal of logic level "1" is inputted in the first word-line WL1, second word-line WL2, third word-line WL3 and fourth word-line WL4 in sequence to read the data stored in the corresponding DRAM cells ($DC_{11}$, $DC_{12}$, $DC_{13}$), ($DC_{21}$, $DC_{22}$, $DC_{23}$), ($DC_{31}$, $DC_{32}$, $DC_{33}$) and ($DC_{41}$, $DC_{42}$, $DC_{43}$), respectively. If the reading data/datum of the DRAM cell(s) $DC_{22}$ and/or $DC_{32}$ are/is a logic level "0", the DRAM cell(s) $DC_{22}$ and/or $DC_{32}$ are/is not (a) floating cell(s). However, if the reading data/datum of the DRAM cell(s) $DC_{22}$ and/or $DC_{32}$ are/is a logic level "1" consistent with the original stored data logic level "1," the corresponding second inverted bit-line $\overline{BL_2}$ and second bit-line $BL_2$ may be coupled to the adjacent first bit-line $BL_1$ with a logic level "0" and third bit-line $BL_3$ with a logic level "1" via the parasitic capacitors $CP_1$ and $CP_2$ respectively to cause the reading data/datum of the DRAM cell(s) $DC_{22}$ and/or $DC_{32}$ to be a logic level "0". However, this may be caused by a short circuit rather than floating cell(s). To further determine whether or not the DRAM cells $DC_{22}$ and $DC_{32}$ are floating cells, step 18 must be performed; and (5) In step 18 (S18), steps 10 and 14 are repeated, wherein the first background data is replaced with a third background data (shown in FIG. 5). That is, the data stored in the DRAM cells ($DC_{11}$, $DC_{12}$, $DC_{13}$), ($DC_{21}$, $DC_{22}$, $DC_{23}$), ($DC_{31}$, $DC_{32}$, $DC_{33}$) and ($DC_{41}$, $DC_{42}$, $DC_{43}$) are all a logic level "1." If the reading data/datum of the DRAM cell(s) $DC_{22}$ and/or $DC_{32}$ are/is consistent with the original stored logic level "1," it means that DRAM cell(s) $DC_{22}$ and/or $DC_{32}$ are not floating cell(s). On the contrary, if the reading data/datum of the DRAM cell(s) $DC_{22}$ and/or $DC_{32}$ are/is not consistent with the original stored logic level "1," that is, the reading data/datum of the DRAM cell(s) $DC_{22}$ and/or $DC_{32}$ are/is a logic level "0," the DRAM cell(s) $DC_{22}$ and/or $DC_{32}$ are/is likely to be (a) floating cell(s). Next, steps 14 and 16 are repeated, wherein the second background data is replaced with a fourth background data (shown in FIG. 6). Furthermore, the data stored in the DRAM cells ($DC_{11}$, $DC_{21}$, $DC_{31}$, $DC_{41}$) and ($DC_{13}$, $DC_{23}$, $DC_{33}$, $DC_{43}$) are all a logic level "1" while the data stored in the suspicious floating DRAM cells $DC_{22}$ and $DC_{32}$ are a logic level "0." The data stored in the other DRAM cells $DC_{12}$ and $DC_{42}$ can be a logic level "1" or "0" (marked with label "식" in FIG. 6). If the reading data/datum of the suspicious DRAM cell(s) $DC_{22}$ and/or $DC_{32}$ are/is not consistent with the original stored logic level "0", that is, the reading data/datum of the DRAM cell(s) $DC_{22}$ and/or $DC_{32}$ are/is a logic level "1," it means that the DRAM cell(s) $DC_{22}$ and/or $DC_{32}$ are/is not (a) floating cell(s). On the contrary, if the reading data/datum of the suspicious DRAM cell(s) $DC_{22}$ and/or $DC_{32}$ are/is consistent with the original stored logic level "0," it represents that the DRAM cell(s) $DC_{22}$ and/or $DC_{32}$ are/is indeed (a) floating cell(s).

Unlike the physical failure analysis used in the prior art, a method for quickly identifying floating cells by a bit-line coupling pattern according to the invention, an electronic analysis, not only swiftly identifies floating cells, but also has the advantage of low cost.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for quickly identifying floating cells by a bit-line coupling pattern, suitable for a dynamic random access memory which has a plurality of word-lines, wherein each word-line controls a plurality of corresponding DRAM cells which correspond to a plurality of pairs of bit-lines, comprising the following steps of:

inputting first background data to said DRAM cells of each word-line, wherein the first background data are all a first logic level;

selecting said word-lines to read said first background data stored in said corresponding DRAM cells, wherein if the reading data of said DRAM cells are all a first logic level, said DRAM cells are not floating cells while if the reading datum/data of at least one DRAM cell is/are a second logic level, it represents that said at least one DRAM cell may be (a) floating cell(s);

inputting second background data to said DRAM cells of each word-line, wherein the datum/data stored in said at least one DRAM cell is/are a second logic level and the data stored in DRAM cells on adjacent pairs of bit-lines are a first logic level while the data stored in the other DRAM cells can be a first logic level or second logic level;

selecting said word-lines to read the data stored in said corresponding DRAM cells, wherein if the datum/data of said at least one DRAM cell is/are a first logic level, said at least DRAM cell is/are not floating cell(s) while if the datum/data of said at least DRAM cell is/are a second logic level, said at least DRAM cell may be (a) floating cell(s);

inputting third background data to said DRAM cells of each word-line, wherein the third background data are all a second logic level;

selecting said word-lines to read the data stored in said corresponding DRAM cells, wherein if the reading datum/data of said at least one DRAM cell is/are a second logic level, said at least one DRAM cell is/are not (a) floating cell(s) while if the reading datum/data of said at least one DRAM cell is/are a first logic level, it represents that said at least one DRAM cell are/is likely to be (a) floating cell(s);

inputting fourth background data to said DRAM cells of each word-line, wherein the datum/data stored in said at least one DRAM cell is/are a first logic level and the data stored in DRAM cells on adjacent pairs of bit-lines are a second logic level while the data stored in the other DRAM cells can be a first logic level or second logic level;

selecting said word-lines to read the data stored in said corresponding DRAM cells, wherein if the datum/data of said at least one DRAM cell is/are a second logic level, it means that said at least DRAM cell is/are not (a) floating cell(s) while if the datum/data of said at least DRAM cell is/are a first logic level, it represents that said at least DRAM cell is/are indeed (a) floating cell(s).

2. A method for quickly identifying floating cells by a bit-line coupling pattern as claimed as 1, wherein said first logic level is "0."

3. A method for quickly identifying floating cells by a bit-line coupling pattern as claimed as 2, wherein said second logic level is "1."

4. A method for quickly identifying floating cells by a bit-line coupling pattern as claimed as 1, wherein said first logic level is "1."

5. A method for quickly identifying floating cells by a bit-line coupling pattern as claimed as 4, wherein said second logic level is "0."

6. A method for quickly identifying floating cells by a bit-line coupling pattern as claimed as 1, wherein said selecting each word-line is accomplished by inputting a signal of logic level "1" to each word-line.

* * * * *